United States Patent
Chu et al.

(10) Patent No.: US 6,451,706 B1
(45) Date of Patent: Sep. 17, 2002

(54) ATTENUATION OF REFLECTING LIGHTS BY SURFACE TREATMENT

(75) Inventors: Ron-Fu Chu; Yang Pan; Qun Ying Lin; Mei Sheng Zhou, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 1094 days.

(21) Appl. No.: 08/657,219

(22) Filed: Jun. 3, 1996

(51) Int. Cl.$^7$ .................. H01L 21/302; H01L 21/461; G03C 5/00
(52) U.S. Cl. .................. 438/725; 216/79; 430/313; 430/320; 430/323; 438/710; 438/719
(58) Field of Search .................. 438/710, 719, 438/725; 216/67, 79; 430/313, 320, 323

(56) References Cited

U.S. PATENT DOCUMENTS

| | | | | |
|---|---|---|---|---|
| 4,454,044 A | * | 6/1984 | Hackleman et al. | ......... 156/643 |
| 5,007,982 A | * | 4/1991 | Tsuo | ......... 156/643 |
| 5,182,234 A | * | 1/1993 | Meyer | ......... 437/233 |
| 5,324,689 A | | 6/1994 | Yoo | ......... 437/228 |
| 5,670,298 A | * | 9/1997 | Hur | ......... 430/318 |

* cited by examiner

*Primary Examiner*—S. H Ver Steeg

(74) *Attorney, Agent, or Firm*—George O. Saile; Rosemary L. S. Pike

(57) ABSTRACT

A new method of avoiding resist notching in the formation of a polysilicon gate electrode in the fabrication of an integrated circuit device is described. Bare active areas are provided surrounded by field oxide isolation on a semiconductor substrate wherein the surface of the substrate has an uneven topography due to the uneven interface between the active areas and the isolation. A polysilicon layer is deposited over the active areas and the field oxide isolation of the substrate. The surface of the polysilicon layer is roughened using a plasma etching process wherein pits are formed on the surface which act as light traps. The roughened polysilicon layer is covered with a layer of photoresist. Portions of the photoresist layer are exposed to actinic light wherein reflection lights from the actinic light are trapped in the pits. The reflection lights do not reflect onto the unexposed portion of the photoresist layer. The photoresist layer is developed and patterned to form the desired photoresist mask for the polysilicon layer wherein the absence of reflection lights reflecting onto the unexposed portion of the photoresist results in the notch-free photoresist mask in the formation of a polysilicon gate electrode in the fabrication of an integrated circuit device.

13 Claims, 3 Drawing Sheets

ATTENUATION OF REFLECTING LIGHTS BY SURFACE TREATMENT

BACKGROUND OF THE INVENTION (1) Field of the Invention

The invention relates to a method of reducing surface reflectivity and eliminating directional reflection lights from substrates during photolithography processes in the manufacture of integrated circuits.

(2) Description of the Prior Art

Referring to FIG. 1, there is shown a portion of a partially completed integrated circuit in which there is a silicon substrate 10. Field oxide regions 12 are formed in and on the silicon substrate resulting in a uneven topography of the top surface of the substrate. A layer 14 of polysilicon is deposited over the surface of the substrate. A layer of photoresist 16 coats the surface of the polysilicon layer 14 and planarizes the substrate. When the photoresist is exposed to actinic light, light waves 18 will reflect off the polysilicon surface onto the unexposed portion of the photoresist 20. After the photoresist is developed, as shown in FIG. 2, notches 22 will be found in the resulting photomask. These notches 22 are caused by directional reflection lights.

Anti-reflection coatings (ARC) have been used in semiconductor manufacturing to suppress reflection lights during the masking process. The use of ARC's allows for the definition of sharp images and the avoidance of resist notching. However, these additional ARC layers are expensive, require additional process steps, and difficult to control in manufacturing.

U.S. Pat. No. 5,324,689 to Yoo teaches a different method of avoiding resist notching. Yoo uses a spin-on-glass layer underlying the photoresist layer. This allows the photoresist layer to have a uniform thickness, thus avoiding the reflection problem caused by the differing photoresist depths.

SUMMARY OF THE INVENTION

Accordingly, it is a principal object of the present invention to provide an effective and very manufacturable method of avoiding resist notching during photolithography across an uneven topography.

Another object of the present invention is to reduce surface reflectivity of surfaces having an uneven topography.

A further object of the present invention is to eliminate directional reflection lights from substrates.

Yet another object is to create micro light traps which reduce surface reflectivity and eliminate directional reflection lights from substrates.

In accordance with the objects of this invention a new method of avoiding resist notching in the formation of a polysilicon gate electrode in the fabrication of an integrated circuit device is achieved. Bare active areas are provided surrounded by field oxide isolation on a semiconductor substrate wherein the surface of the substrate has an uneven topography due to the uneven interface between the active areas and the isolation. A polysilicon layer is deposited over the active areas and the field oxide isolation of the substrate. The surface of the polysilicon layer is roughened using a plasma etching process wherein pits are formed on the surface which act as light traps. The roughened polysilicon layer is covered with a layer of photoresist. Portions of the photoresist layer are exposed to actinic light wherein reflection lights from the actinic light are trapped in the pits. The reflection lights do not reflect onto the unexposed portion of the photoresist layer. The photoresist layer is developed and patterned to form the desired photoresist mask for the polysilicon layer wherein the absence of reflection lights reflecting onto the unexposed portion of the photoresist results in the notch-free photoresist mask in the formation of a polysilicon gate electrode in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
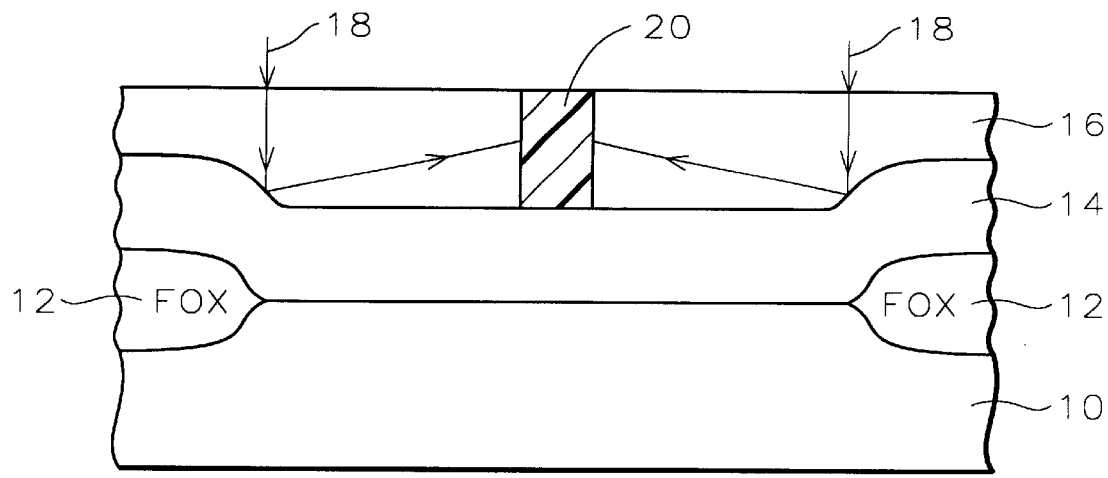
FIGS. 1 and 2 schematically illustrate in cross-sectional representation some drawbacks of the conventional Prior Art process.
Figure 2:
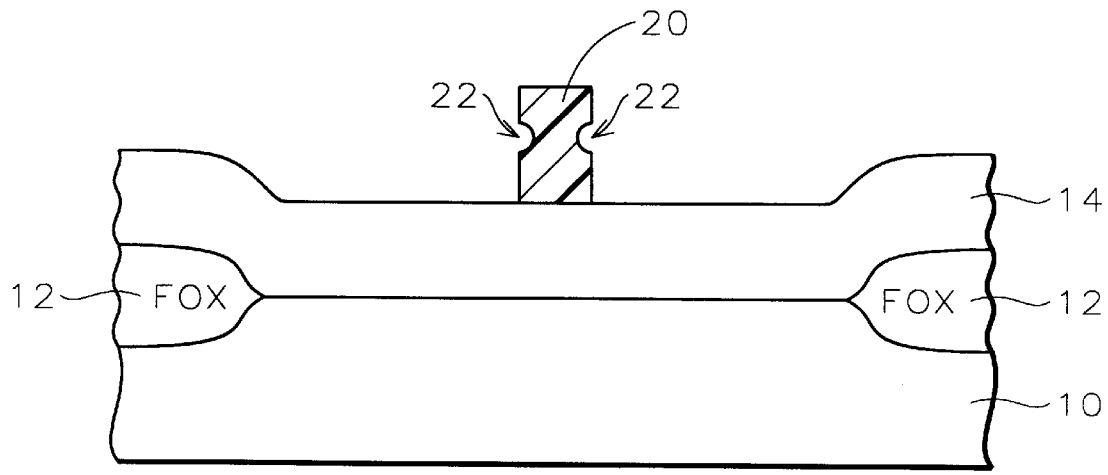
Figure 3:
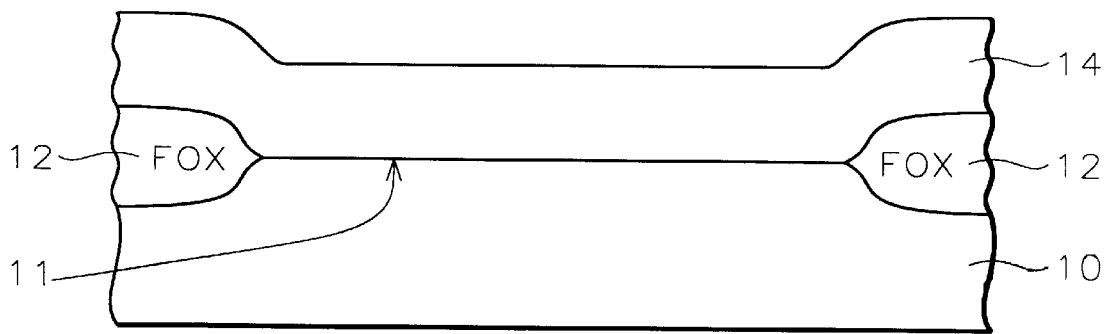
FIGS. 3 through 6 schematically illustrate in cross-sectional representation a preferred embodiment of the present invention.

Referring now more particularly to FIGS. 3 through 6, the process of the present invention will be described. A portion of a partially completed integrated circuit is illustrated in FIG. 3 consisting of a semiconductor substrate 10, preferably composed of monocrystalline silicon. Field oxide regions 12 have been formed as is conventional in the art in the semiconductor substrate 10 resulting in an uneven topography of the surface of the substrate. The height of the field oxide regions 12 over the surface 11 of the active region of the substrate may be from between about 3000 to 5000 Angstroms. A layer 14 of polysilicon is deposited over the uneven surface of the substrate to a thickness of, for example, between about 2500 to 3500 Angstroms.

Figure 4:
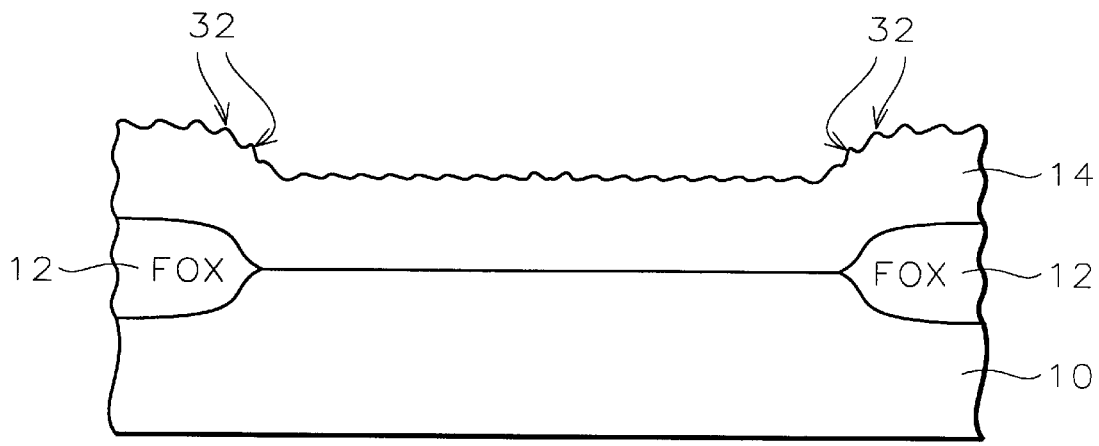

Now, the key feature of the present invention will be described. The surface of the polysilicon layer is treated to reduce surface reflectivity. The surface treatment comprises a polysilicon plasma etch for a brief time. This is a similar etch recipe to that which will be used after masking to etch through the polysilicon. At this time, the plasma etching is performed for a very brief time, for between about 5 to 20 seconds, and preferably, for between about 8 to 20 seconds. This plasma treatment pits the surface of the substrate, as illustrated in FIG. 4. The pits 32 in the polysilicon surface act as microscopic light traps.

Figure 5:
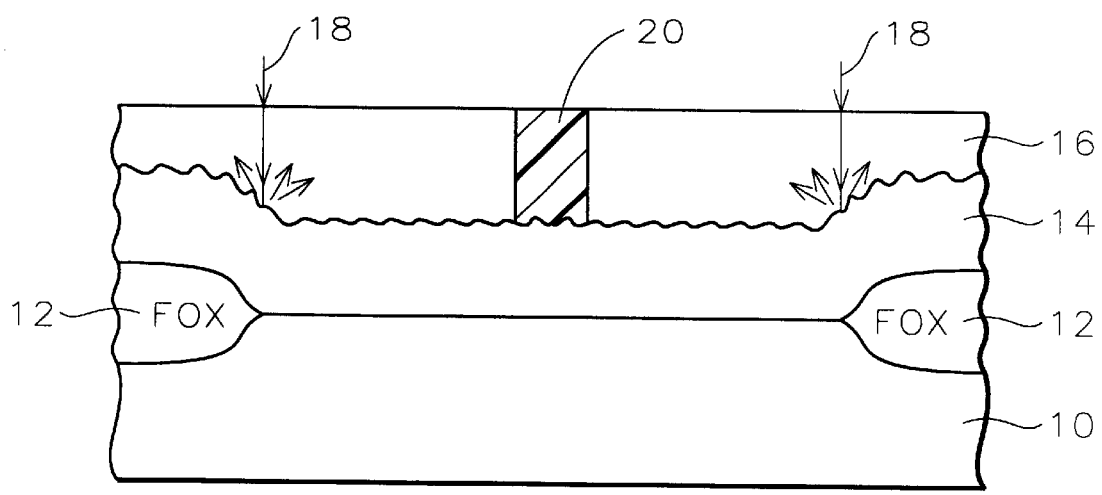

Referring now to FIG. 5, a layer of photoresist 16 is coated over the roughened surface of the substrate. When the photoresist is exposed to actinic light, the roughened surface of the polysilicon traps the refection lights. Directional reflection lights are eliminated. Light waves 18 are reflected very little and nondirectionally. The unexposed photoresist 20 is not notched by reflected light waves.

Figure 6:
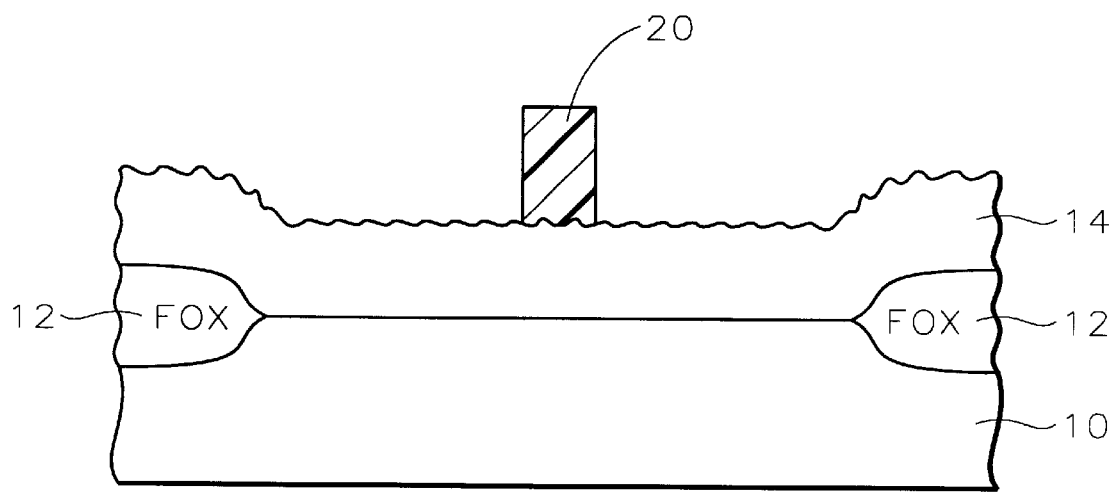
Figure 7:
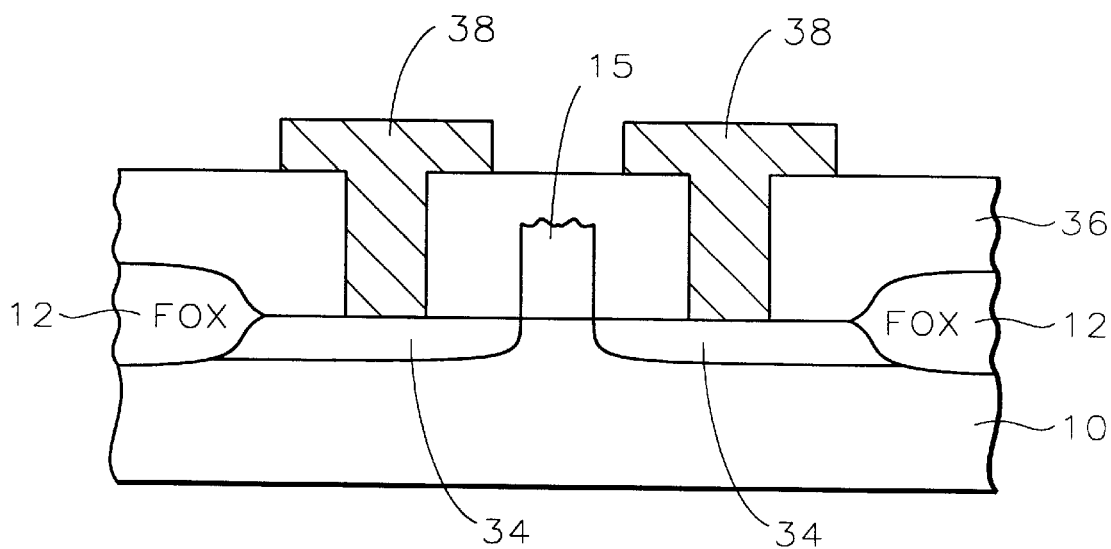
FIG. 7 schematically illustrates in cross-sectional representation a completed integrated circuit device fabricated by the process of the present invention.

After development of the photoresist, the photoresist mask 20, shown in FIG. 6, has no notching. Processing continues as is conventional in the art. For example, the polysilicon 14 is etched to form a gate electrode 15, as illustrated in FIG. 7. Source and drain regions 34 are formed. Insulating layer 36 covers the gate electrode 15. An opening is etched through the insulating layer to contact one of the source and drain regions 34. A conducting layer 38 is deposited and patterned to complete the electrical connections in the integrated circuit device.

The process of the present invention provides a robust and very manufacturable method of avoiding resist notching. No additional materials, such as anti-reflective coatings, are required. The roughened surface of the polysilicon is sufficient to eliminate directional reflecting light which eliminates resist notching.

EXAMPLE

The following Example is given to show the important features of the invention and to aid in the understanding thereof. Variations may be made by one skilled in the art without departing from the spirit and scope of the invention.

Table 1 illustrates the plasma surface treatment etch recipe of the present invention.

TABLE 1

| Step | 1 | 2 | 3 | 4 | 5 | 6 |
|---|---|---|---|---|---|---|
| Pressure (mTorr) | 750 | 750 | 400 | 400 | 400 | 200 |
| RF Top (W) | 0 | 250 | 0 | 0 | 400 | 0 |
| RF Bottom (W) | 0 | 0 | 0 | 0 | 0 | 0 |
| Gap (cm) | 0.75 | 0.75 | 0.75 | 0.75 | 0.75 | 5.25 |
| $Cl_2$ (ccm) | 0 | 0 | 350 | 350 | 350 | 0 |
| HBr (ccm) | 0 | 0 | 125 | 125 | 125 | 0 |
| $O_2$ (ccm) | 0 | 0 | 0 | 0 | 0 | 0 |
| He (ccm) | 0 | 0 | 0 | 0 | 0 | 0 |
| $C_2F_6$ (ccm) | 0 | 0 | 0 | 0 | 0 | 0 |
| $SF_6$ (ccm) | 0 | 0 | 0 | 0 | 0 | 0 |
| $CF_4$ (ccm) | 100 | 100 | 0 | 0 | 0 | 0 |
| $CHF_3$ (ccm) | 0 | 0 | 0 | 0 | 0 | 0 |
| He Clamp (T) | 0 | 0 | 0 | 6 | 6 | 0 |
| Completion | stabl | Time | stabl | stabl | Time | End |
| Time (sec) | 30 | X | 30 | 30 | Y | 30 |

Breakthrough time X and polysilicon cap etch time Y were varied to get the lowest reflectivity under a stable process. In experiments, flat wafers having 1700 Angstroms of polysilicon, 1250 Angstroms of tungsten silicide thereover, and a 550 Angstrom polysilicon cap were treated using the plasma treatment of the invention. The surface reflectivity of the wafers was measured before and after the roughening treatment. The treatment duration for two wafers was 10 seconds for breakthrough of the native oxide and 5 seconds for the polysilicon cap etch. Five other wafers were treated with 8 seconds of polysilicon cap etch.

The standard polysilicon cap reflectivity is about 90% (100% for silicon at 365 nm). Table 2 shows the reflectivity before and after surface treatment using the two different recipes.

TABLE 2

| recipe | reflectivity | |
|---|---|---|
| X + Y(seconds) | before | after |
| 10 + 5 | 90% | 81% |
| 10 + 5 | 90% | 81% |
| 0 + 8 | 90% | 83% |
| 0 + 8 | 90% | 83% |
| 0 + 8 | 84% | 67% |
| 0 + 8 | 86% | 69% |
| 0 + 8 | 85% | 76% |

Table 3 compares the process flow of a conventional bottom ARC process with the roughened surface process of the present invention.

TABLE 3

| Steps | Bottom ARC | Rough Surface |
|---|---|---|
| 1 | deposit poly | deposit poly |
| 2 | coat ARC | surface treatment |
| 3 | masking | masking |
| 4 | etch ARC | etch poly |
| 5 | etch poly | |
| 6 | strip resist | strip resist |
| 7 | remove ARC | |
| 8 | next step | next step |

As can be seen from Table 3 above, two steps are eliminated using the rough surface process of the present invention as well as avoiding the expensive bottom ARC material.

The plasma surface treatment of the present invention is the most cost effective and manufacturable method of reducing polysilicon reflectivity as compared with either organic or inorganic bottom anti-reflective coating methods. Using the plasma surface treatment of the present invention, the reflectivity of the polysilicon is reduced from 90% to between about 70% to 83%, which is up to a 20% reduction, with an average reduction in reflectivity of 15%. The uniformity of reflectivity over the wafer surface is good with a standard deviation of less than 1%. The roughness of the polysilicon is less than 50 Angstroms. This will not cause thickness uniformity problems for the photoresist coating. Notching is significantly reduced and a larger notching window is achieved using the process of the invention. Furthermore, photolithography performance (process windows, critical dimension uniformity, and proximity effect) is better with the process of the invention than with the conventional process.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon gate electrode in the fabrication of an integrated circuit device comprising:

providing bare active areas surrounded by field oxide isolation on a semiconductor substrate wherein the surface of said substrate has an uneven topography due to the uneven interface between said active areas and said isolation;

depositing a polysilicon layer over said active areas and said field oxide isolation of said substrate;

roughening the surface of said polysilicon layer to a depth of less than 50 Angstroms;

covering said roughened polysilicon layer with a layer of photoresist;

exposing portions of said photoresist layer not covered by a mask to actinic light wherein other portions of said photoresist layer covered by said mask are unexposed;

developing and patterning said photoresist layer to form the desired photoresist mask for said polysilicon layer; and etching away said polysilicon layer where it is not covered by said photoresist mask to form said polysilicon gate electrode wherein said polysilicon gate electrode has a roughened polysilicon surface in the fabrication of said integrated circuit device.

2. The method according to claim 1 wherein said polysilicon surface roughening is accomplished using a plasma etching process wherein pits are formed on said surface and wherein said pits act as light traps.

3. The method according to claim 2 wherein said plasma etching process is applied for a duration of between about 5 to 20 seconds.

4. The method according to claim 2 wherein said plasma etching process is applied for a duration of between about 8 to 20 seconds.

5. The method according to claim 1 wherein reflection lights from said actinic light are trapped by said roughened polysilicon surface and wherein said reflection lights do not reflect onto said unexposed portions of said photoresist layer.

6. The method according to claim 1 wherein said roughened polysilicon layer has a reflectivity reduced by an average of 15% over the reflectivity of a conventional polysilicon layer that has not been roughened.

7. A method of forming a polysilicon gate electrode in the fabrication of an integrated circuit device comprising:

provingding bare active areas surrounded by field oxide isolation on a semiconductor substrate wherein the surface of said substrate has an uneven topography due to the uneven interface between said active areas and said isolation;

depositing a polysilicon layer over said active areas and said field oxide isolation of said substrate;

roughening the surface of said polysilicon layer to a depth of less than 50 Angstroms using a plasma etching process applied for between about 5 and 20 seconds wherein pits are formed on said surface and wherein said pits act as light traps;

covering said roughened polysilicon layer with a layer of photoresist;

exposing portions of said photoresist layer not covered by a mask to actinic light wherein other portions of said photoresist layer covered by said mask are unexposed wherein reflection lights from said actinic light are trapped in said pits and wherein said reflection lights do not reflect onto said unexposed portions of said photoresist layer;

developing and patterning said photoresist layer to form the desired photoresist mask for said polysilicon layer; and etching away said polysilicon layer where it is not covered by said photoresist mask to form said polysilicon gate electrode wherein said polysilicon gate electrode has a roughened polysilicon surface in the fabrication of said integrated circuit device.

8. The method according to claim 7 wherein said plasma etching process is applied for a duration of between about 8 to 20 seconds.

9. The method according to claim 7 wherein said roughened polysilicon layer has a reflectivity reduced by an average of 15% over the reflectivity of a conventional polysilicon layer that has not been roughened.

10. A method of forming a notch-free photoresist mask in the formation of a polysilicon gate electrode in the fabrication of an integrated circuit device comprising:

providing bare active areas surrounded by field oxide isolation on a semiconductor substrate wherein the surface of said substrate has an uneven topography due to the uneven interface between said active areas and said isolation;

depositing a polysilicon layer over said active areas and said field oxide isolation of said substrate;

roughening the surface of said polysilicon layer using a plasma etching process to a depth of less than 50 Angstroms wherein pits are formed on said surface and wherein said pits act as light traps;

covering said roughened polysilicon layer with a layer of photoresist;

exposing portions of said photoresist layer not covered by a mask to actinic light wherein other portions of said photoresist layer covered by said mask are unexposed wherein reflection lights from said actinic light are trapped in said pits and wherein said reflection lights do not reflect onto said unexposed portions of said photoresist layer; and developing and patterning said photoresist layer to form the desired photoresist mask for said polysilicon layer wherein the absence of reflection lights reflecting onto said unexposed portions of said photoresist results in said notch-free photoresist mask in the formation of said polysilicon gate electrode in said fabrication of said integrated circuit device.

11. The method according to claim 10, wherein said plasma etching process is applied for a duration of between about 5 to 20 seconds.

12. The method according to claim 10 wherein said plasma etching process is applied for a duration of between about 8 to 20 seconds.

13. The method according to claim 10 wherein said roughened polysilicon layer has a reflectivity reduced by an average of 15% over the reflectivity of a conventional polysilicon layer that has not been roughened.

* * * * *